United States Patent
Kim et al.

(10) Patent No.: US 7,244,983 B2
(45) Date of Patent: Jul. 17, 2007

(54) METHOD AND DEVICE FOR ON-CHIP DECOUPLING CAPACITOR USING NANOSTRUCTURES AS BOTTOM ELECTRODE

(75) Inventors: Sarah E. Kim, Portland, OR (US); Scot A. Kellar, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 10/420,774

(22) Filed: Apr. 23, 2003

(65) Prior Publication Data
US 2005/0101099 A1 May 12, 2005

Related U.S. Application Data

(62) Division of application No. 09/949,927, filed on Sep. 12, 2001, now Pat. No. 6,599,808.

(51) Int. Cl.
*H01L 27/108* (2006.01)

(52) U.S. Cl. .................. 257/309; 257/40; 257/532; 977/734; 977/720; 977/784

(58) Field of Classification Search .......... 977/DIG. 1, 977/734, 720, 784; 257/40, 296, 309, 532; 361/502
See application file for complete search history.

(56) References Cited

U.S. PATENT DOCUMENTS

| | | | |
|---|---|---|---|
| 5,034,850 A | 7/1991 | Hernandez et al. | |
| 5,366,931 A | 11/1994 | Kim | |
| 5,472,900 A | 12/1995 | Vu et al. | |
| 5,589,152 A * | 12/1996 | Tennent et al. | 423/447.3 |
| 5,811,868 A | 9/1998 | Bertin et al. | |
| 6,031,711 A * | 2/2000 | Tennent et al. | 361/303 |
| 6,037,612 A | 3/2000 | Nishimura et al. | |
| 6,361,861 B2 * | 3/2002 | Gao et al. | 428/367 |
| 6,414,836 B1 * | 7/2002 | Tennent et al. | 361/313 |
| 6,454,816 B1 * | 9/2002 | Lee et al. | 29/25.03 |
| 6,455,916 B1 * | 9/2002 | Robinson | 257/532 |

\* cited by examiner

*Primary Examiner*—Douglas M. Menz
(74) *Attorney, Agent, or Firm*—Blakely, Sokoloff, Taylor & Zafman LLP (57) ABSTRACT

Apparatus for an on-chip decoupling capacitor. The capacitor includes a bottom electrode that consist of nanostructures deposited over a planarized metal, a dielectric material deposited over the nanostructures, and a top electrode deposited over the dielectric material. The shape of the bottom electrode is tunable by modulating the diameter and/or the length of the nanostructures to produce an increase in capacitance without increasing the footprint of the on-chip decoupling capacitor.

14 Claims, 6 Drawing Sheets

METHOD AND DEVICE FOR ON-CHIP DECOUPLING CAPACITOR USING NANOSTRUCTURES AS BOTTOM ELECTRODE

This is a divisional of patent application Ser. No.09/949,927, filed Sep. 12, 2001, now U.S. Pat. No. 6,599,808.

BACKGROUND

1. Field of the Invention

This invention relates to decoupling capacitors, and more specifically to on-chip decoupling capacitors.

2. Background Information

As electronic devices operate at higher frequencies the need for low-inductance power delivery increases. At high frequencies, inductive voltage drop and electronic noise are serious problems for electronic device designers. Small inductance current sources help to ameliorate many of the problems of switching electronic devices at high frequencies. The main source of inductance in electronic devices is the wire leads carrying current to the transistors. Capacitors act as local power sources for transistors. Situating the capacitors closer to the transistors shortens the length of the leads and reduces the inductance of the power delivery system, allowing the transistors to be switched at much greater frequencies. These local capacitors also allow the transistors to operate at higher frequencies for the same power consumption or at the same frequency with less power consumption.

For performance reasons such as above, or other reasons, it may be desired to increase the total capacitance on a die. Generally, in order to achieve large capacitance: (1) capacitor surface area must increase; (2) dielectric constant (K) of the dielectric layer must increase; or (3) dielectric film thickness must to decrease. With the increasing speed of electronic devices, and with shrinking die size, the challenge is to increase the total capacitance on a die within a fixed area. Currently decoupling capacitors are put into the package, but these are high inductance configurations and are limited at high frequencies.

Therefore, there is a need for method and apparatus that increases capacitance without increasing the footprint of an on-chip decoupling capacitor.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example diagram in an example environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to method and apparatus for an on-chip decoupling capacitor where the bottom electrode of the capacitor consists of nanostructures grown or deposited over a planarized metal. The shape of the bottom electrode is tunable by modulating the diameter and/or the height of the nanostructures to produce an increase in capacitance without increasing the footprint of an on-chip decoupling capacitor. An aspect ratio of a nanostructure is defined as the diameter of the nanostructure divided by the length of the nanostructure. High aspect ratio nanostructures provide increased surface area for a capacitor's electrode.

Furthermore, by manipulating the nanostructure geometry it is possible to tune the capacitor to enhance total capacitance or reduce leakage current. In methods and apparatus according to the present invention, a capacitor stack may be inserted between metal layers. The capacitor stack may consist of a nanostructure bottom electrode/barrier, a dielectric material, and a top electrode/barrier. The top electrode/barrier may not be required if a barrier layer serves as a top electrode. Decoupling capacitors mitigate inductive voltage drop, V=Ldi/dt, on the power grid during high surge current conditions. The inclusion of a decoupling capacitor on-die directly between power grids instead of in the package greatly reduces the total inductance (L) in the power supply circuit and provides decoupling to reduce the highest possible frequency noise.

Equation 1 shows the relationship among parameters that determine capacitance.

$$C = \frac{\varepsilon_o \varepsilon A}{d} \quad (1)$$

'$\varepsilon_o$' represents the free space permittivity. '$\varepsilon$' is the dielectric constant (i.e., K). 'A' represents the electrode surface area, and 'd' represents thickness of the dielectric. In order to increase capacitance, C, either surface area, A, or dielectric constant, $\varepsilon$ (K) needs to increase, or thickness d needs to decrease. According to the present invention, the surface area of a capacitor (A) can be increased without increasing real estate on a die, therefore, increasing the capacitance.

According to the present invention, a capacitor stack is inserted between metal layers in the back end of the chip interconnections. Conductive nanostructures may be grown or deposited as a bottom electrode to increase the electrode surface area. The surface area of the nanostructures increases the effective surface area over that of a flat surface. Dielectric may be directly deposited on the bottom electrode, followed by a top electrode. The nanostructure thin film may be used as a template for subsequent capacitor stack deposition to provide an increased surface area of the capacitor and the associated increase in the capacitance.

A nanostructure may be in many forms. For example nanostructures may consist of cylindrical structures (e.g., nanotubes), spherical structures (e.g., buckballs), straw-like structures with hollow centers, ring structures, etc. Nanotubes will be used to illustrate the present invention, however, the present invention is not limited to nanotubes but may be applied to any nanostructure used within the spirit and scope of the present invention.

Figure 1A:
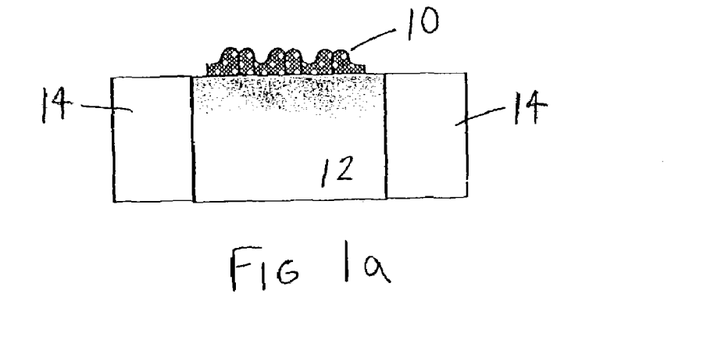
FIGS. 1a–c are diagrams of stages for making a capacitor with nanotubes as a bottom electrode according to an example embodiment of the present invention.
Figure 1B:
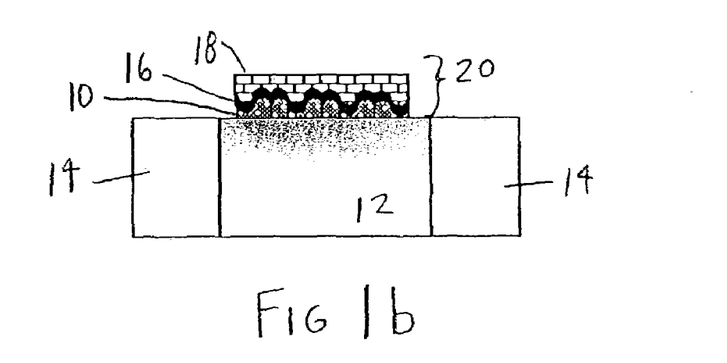
Figure 1C:
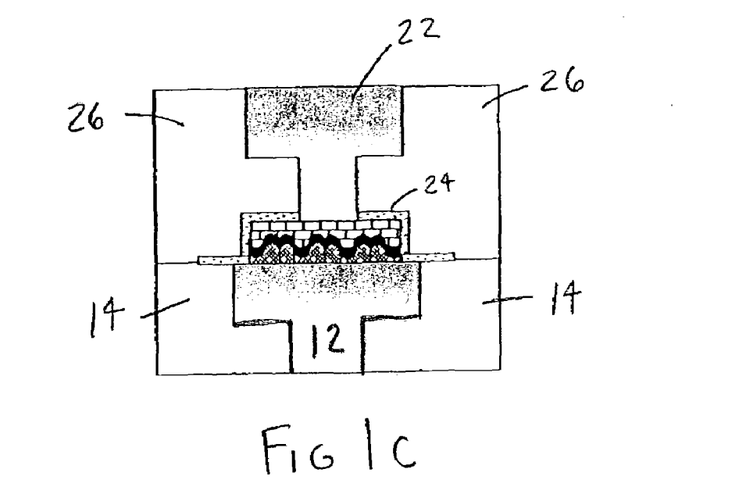

FIGS. 1a–c show diagrams of stages for making a capacitor with nanotubes as a bottom electrode according to an example embodiment of the present invention. FIG. 1a shows a nanotube material 10 deposited (or grown) on a metal 12. The nanotubes are side-by-side and may be connected. There is no exposed metal between nanotubes. The metal 12 may be bordered on each side by a Inter Metal Layer (IMD, ILD) dielectric material 14. Nanotube material 10 may be carbon. The metal 12 may consist of copper.

FIG. 1b shows the result after a dielectric material 16 (e.g., oxide, nitride, high K material, etc.) has been deposited over the nanotubes 10, and a top electrode 18 deposited over the dielectric material 16. Nanotubes 10, dielectric 16, and top electrode 18 form capacitor 20.

FIG. 1c shows capacitor 20 inserted between metal layers 12 and 22. Metal layer 22 is bordered on both sides (similar to metal 12) with ILD dielectric 26. A nitride 24 may be deposited over the top of capacitor 20 and serve to protect the bottom metal layer 12 from contact with top dielectric layer 26 and to serve as an etch stop layer.

Figure 2:
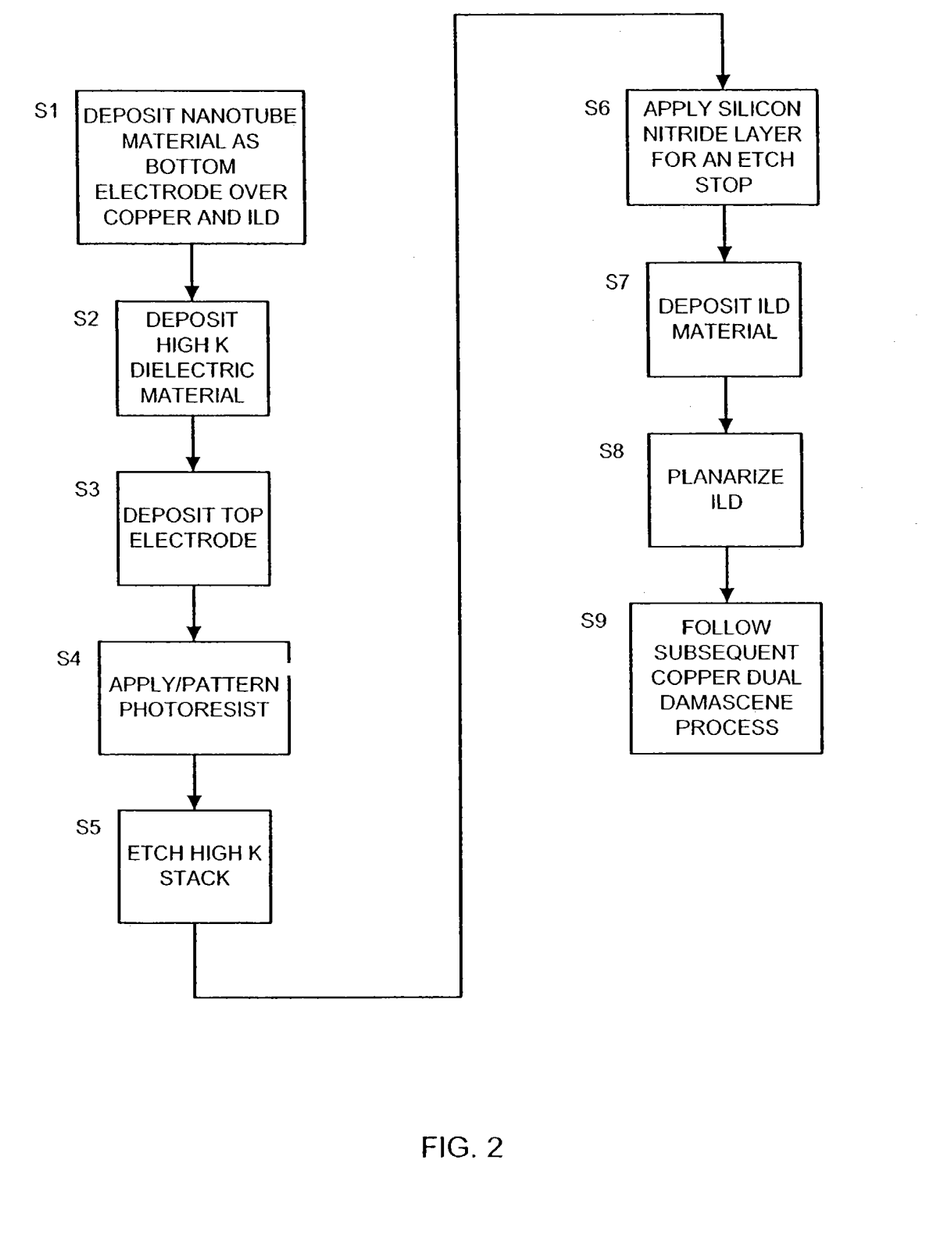
FIG. 2 is a flowchart of a process to make a capacitor stack according to an example embodiment of the present invention.

FIG. 2 shows a flowchart of a process to make a capacitor stack according to an example embodiment of the present invention. Nanotubes are deposited or grown as a bottom electrode over planarized copper and ILD dielectric S1. Deposited nanotubes may have been grown elsewhere. The nanotubes may, for example, be carbon nanotubes or buckyballs. The nanotube material is conductive and able to prevent oxidation and diffusion of the copper during dielectric material deposition in subsequent process steps. If the nanotube material does not have these characteristics, a conductive barrier material may be needed prior to nanotube deposition for the bottom electrode or the conductive barrier material may encapsulate the nanotubes as well.

A dielectric material may be deposited over the bottom electrode S2. Here, an Atomic Layer Chemical Vapor Deposition (ALCVD) like process may be needed for high aspect ratio nanotubes. A top electrode may be deposited over the dielectric material S3. The top electrode material preferably should be chemically inert (i.e., not be oxidized) and prevent diffusion of the copper during further process steps. If the top electrode does not possess these characteristics, both top electrode and conductive barrier may be needed.

A photoresist may be applied S4. The stack (dielectric and electrodes) may be etched S5. A silicon nitride layer may be applied as an etch stop S6. ILD material may then be deposited S7. The ILD may be planarized S8. Here, depending on the position of capacitors, CMP may not be needed. Subsequent copper dual damascene process may follow S9.

Figure 3:
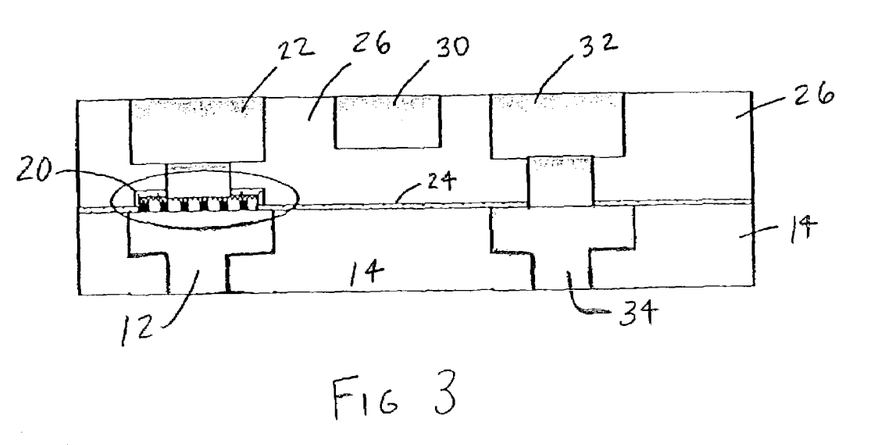
FIG. 3 is a diagram of two metal layers in a die along with a capacitor stack according to an example embodiment of the present invention.

FIG. 3 shows a diagram of two metal layers in a die along with a capacitor stack according to an example embodiment of the present invention. Metal portions 22, 30 and 32 represent a top metal layer, and metal layers 12 and 34 represent a bottom metal layer. The metal layer portion 32 may be directly connected to the bottom metal layer portion 34, as shown. The ellipse shows where the capacitor stack 20 resides between top metal layer portion 22 and bottom metal layer portion 12. A nitride layer 24 exists between dielectric material 26 on the top and dielectric material 14 on the bottom. The nitride protects the bottom metal layer from contacting the top dielectric layer thereby keeping the dielectric from possibly oxidizing the metal.

Nanotubes may have closed or open ends. If the interior surface of the nanotube cannot be adequately covered by dielectric material the end may need to be capped by additional processing before deposition of the top electrode. The diameter of all nanotubes within a specific surface area may be relatively the same. The heights of the nanotubes may also be relatively the same. Carbon is a typical material used to grow nanotubes, however, other materials may also be used and still be within the spirit and scope of the present invention.

Figure 4:
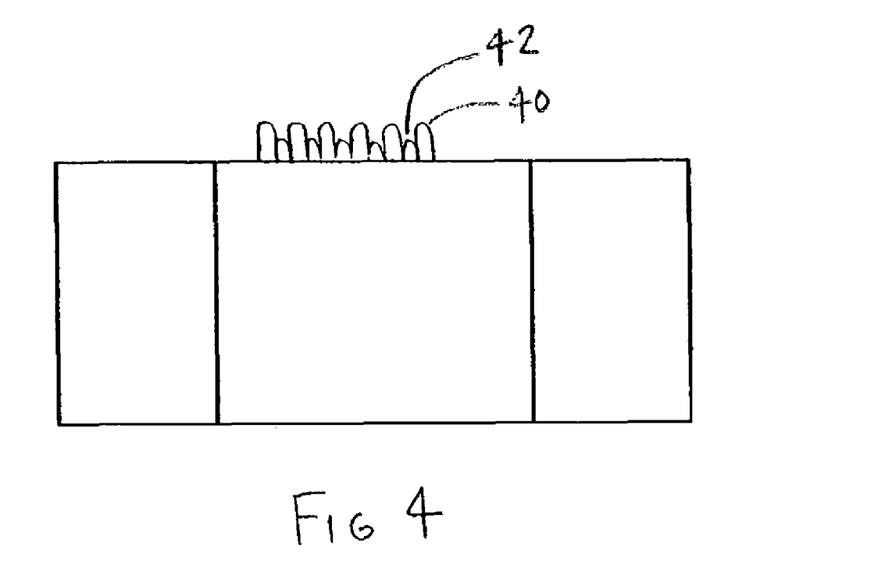
FIG. 4 is a diagram of nanotubes as a bottom electrode according to a second example embodiment of the present invention.

FIG. 4 shows a diagram of nanotubes as a bottom electrode according to a second example embodiment of the present invention. In this embodiment, nanotubes may be grown or deposited in a vertical direction initially where each of the nanotubes are not connected on the sides or the bottom. These first nanotubes 40 are all of approximately the same height. A second set of nanotubes 42 may then be grown or deposited between each of the first type of nanotubes 40 where the second type of nanotubes 42 are smaller in height than the first type nanotubes 40. This embodiment of the present invention provides additional surface area and subsequently additional capacitance in that not only the curvature of the tops of the first and second type nanotubes contribute to the increase in surface area, but also the sides of the first type nanotubes 40 until they touch the second type nanotubes 42 add surface area. Growing nanotubes of different heights such as this may require a more complicated process.

Figure 5:
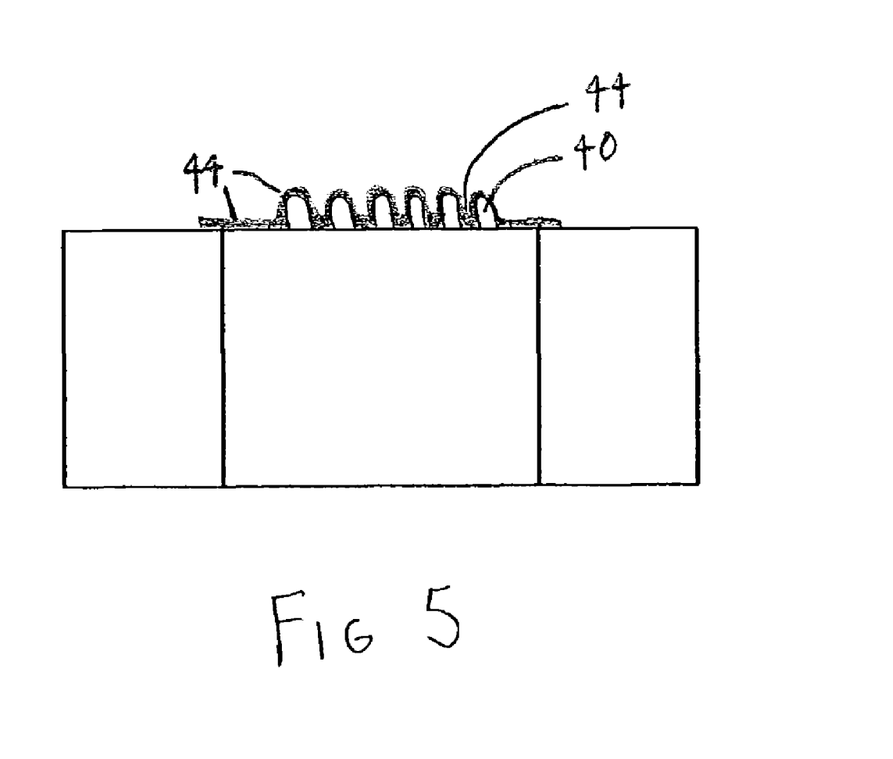
FIG. 5 is a diagram of nanotubes as a bottom electrode according to a third example embodiment of the present invention.

FIG. 5 shows a diagram of nanotubes as a bottom electrode according to a third example embodiment of the present invention. Nanotubes in this embodiment are similar to the embodiment of FIG. 4, in that the first type nanotubes 40 may be grown or deposited and are not connected to each other. However, in this embodiment, if the nanotubes are not conductive, a standard bottom electrode material 44 may be deposited in a conformal fashion over the nanostructure of the first type nanotubes 40 to cover the metal and to electrically connect the nanotubes 40 together, followed by a dielectric. This may involve two or more process steps. The standard bottom electrode material 44 may be the same type used for standard planar capacitors. If the nanotubes are conductive, then there is no need to connect them with electrode material. They only need to be covered with conformal dielectric. This embodiment also provides the additional area, i.e. sides of the nanotubes, and subsequently the additional capacitance similar to FIG. 4.

Figure 6:
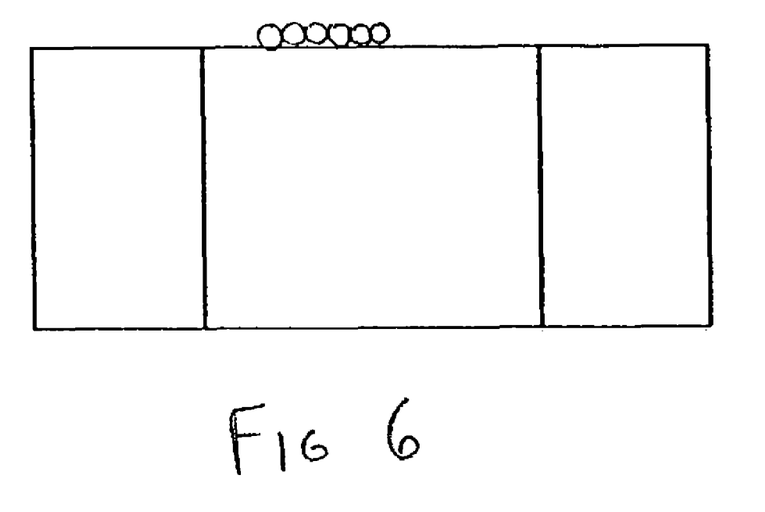
FIGS. 6 and 7 are diagrams of a capacitor with nanotubes as a bottom electrode according to a fourth example embodiment of the present invention.
Figure 7:
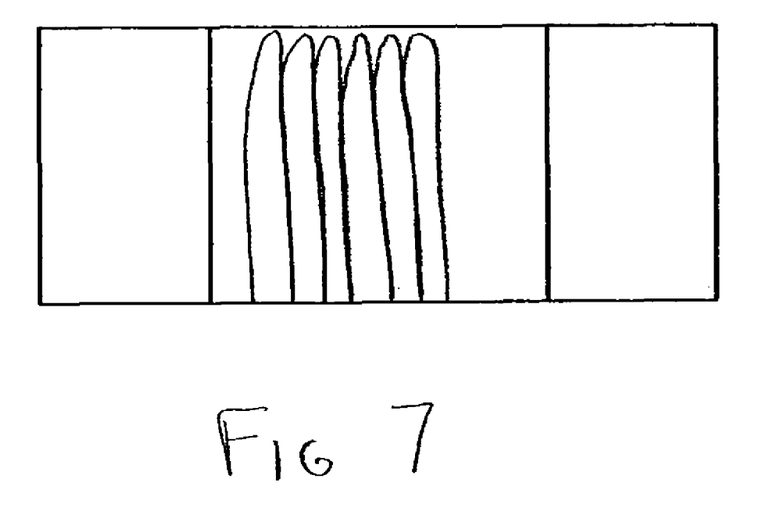

FIGS. 6 and 7 show diagrams of a capacitor with nanotubes as a bottom electrode according to a fourth example embodiment of the present invention. In this embodiment, the nanotubes are not grown/deposited from the bottom up in a vertical direction but are instead grown/deposited in a horizontal direction across the top of the metal. FIG. 6 shows the bottom of each nanotube as it lies horizontally across the top of the metal. FIG. 7 shows a view from the top looking down on the diagram of FIG. 6. In FIG. 7, the individual nanotubes can be seen as they lie horizontally across the top of the metal.

By depositing nanotubes as a bottom electrode, the effective surface area increases (see Equation 1). According to the present invention, nanotubes may be grown with specific desired heights and/or diameters. In the following calculation (Equation 2), the diameter of a nanotube is modeled by ½ of the wavelength.

Figure 8:
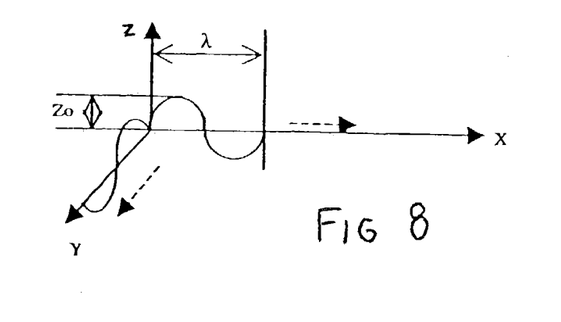
FIG. 8 is a schematic drawing of a uniform sinusoidal surface according to an example embodiment of the present invention.

FIG. 8 shows a schematic drawing of a uniform sinusoidal surface according to an example embodiment of the present invention. X represents one direction of a planar surface and Y represents a perpendicular direction. $Z_0$ represents the amplitude of a curved item grown on a planar surface, and ë represents the wavelength of the curved surface. The wavelength, ë is represented by twice the diameter of, for example, a nanotube grown on a planar surface. Equation 2 may be used to calculate the effective surface area of a non-planar surface.

$$(xy) = \frac{Z_0^2 4\pi^2}{\lambda}\left[\frac{xy}{2} - \frac{\lambda^2}{32\pi^2}\cos\left(\frac{4\pi(x+y)}{\lambda}\right)\right] \quad (2)$$

Using the surface area calculation Equation. 2, the enhanced surface area may be calculated. This equation applies for nanotubes grown in a vertical direction. For embodiments of the present invention where nanotubes are grown horizontally across a planar metal surface, only one directional coordinate may be used (i.e., either X or Y).

Figure 9:
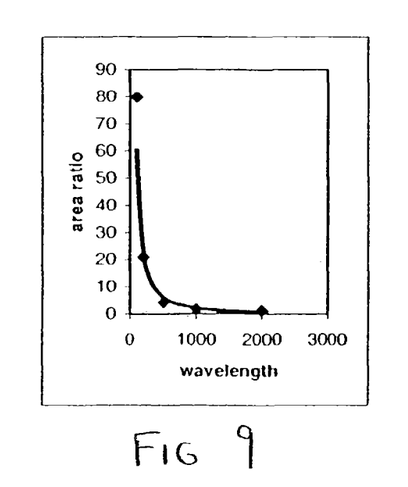
FIG. 9 is a plot of area ratio for a non-planar surface with a constant amplitude according to an example of an embodiment of the present invention.

FIG. 9 is a plot of area ratio for a non-planar surface with a constant amplitude according to an example of an embodiment of the present invention. The area ratio is equal to the enhanced surface area divided by the flat area. As shown in FIG. 9, with a fixed amplitude, the area ratio increases as the wavelength decreases. The units for the wavelength coordinates are in angstroms.

Figure 10:
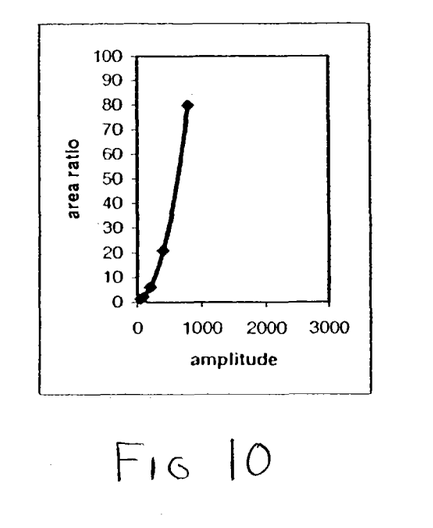
FIG. 10 is a diagram of a plot of area ratio for a non-planar surface with a constant wavelength according to an example embodiment of the present invention.

FIG. 10 shows a diagram of a plot of area ratio for a non-planar surface with a constant wavelength according to an example embodiment of the present invention. In this plot, the wavelength, e.g., twice the diameter of a nanotube, is fixed. The area ratio increases as the amplitude increases.

However, the amplitude increase may reach a point where further increases result in the area ratio only exhibiting minimal gains.

Table 1 shows example surface area ratios with different example wavelengths and example amplitudes. All units are in angstroms except for the area ratio.

TABLE 1

| λ (A) | $Z_0$ (A) | Area Ratio |
|---|---|---|
| 20 | 10 | 5.9 |
| 80 | 60 | 12.1 |
| 200 | 500 | 124.2 |
| 300 | 1000 | 220.1 |
| 100 | 500 | 493.9 |
| 30 | 1000 | 21911.2 |

Table 1 represents example data to help illustrate the present invention but in actuality, the data may not be realistic since there are process limitations. However, as can be seen from the table, a corrugated surface has more surface area. A surface area generally may increase with decreasing wavelength and increasing amplitude. An optimal point of area ratio may be reached that may be determined by the process used. This optimum represents the maximum area ratio obtainable by varying the wavelength and amplitude of the nanotubes.

The curve at the top of each nanotube gives the area increase if the sides of the nanotubes touch. Therefore, in this case, the amplitude is equal to the radius of the curvature. As noted previously, in this model the diameter of a nanotube is represented by ½ the wavelength. The height of the nanotubes add thickness to this particular layer (i.e., bottom electrode). However, in embodiments where different nanotubes are grown with varying heights, the sides of the nanotubes also add additional area. In embodiments according to the present invention such as these (e.g., FIGS. 4 and 5) additional calculations other than Equation 2 may be required to calculate the area along the sides of the nanotubes.

Methods and apparatus according to the present invention are advantageous for several reasons. Capacitance may be increased without increasing the footprint of an on-chip decoupling capacitor. The need for developing a new high K dielectric material is reduced. Further, the need for a three-dimensional litho structure to produce an area enhancement is reduced. Methods and apparatus according to the present invention have lower inductance, L compared to off-chip surface mount capacitors designs because the leads to the transistors are much shorter. Moreover, methods and apparatus according to the present invention have less leakage and no consumption of a die area like gate electrode methods. Methods and apparatus according to the present invention also have greater capacitance density compared to planar capacitors. In addition, the shape of the bottom electrode is tunable in many ways since nanotube size, both diameter and length, can be easily modulated. In methods and apparatus according to the present invention, low breakdown voltage can be obtained because of the smooth surface of the nanotubes, and orders of magnitude area enhancement can be obtained with extremely high aspect ratio nanotubes.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as a re within the scope of the appended claims.

What is claimed is:

1. An on-chip decoupling capacitor comprising:
    a bottom electrode comprising a layer of nanostructures deposited over a planarized metal;
    a dielectric layer deposited directly on the layer of nanostructures;
    a top electrode formed directly on the dielectric layer, the top electrode including one or more conductive layers; and
    a nitride deposited on at least exposed portions of the bottom electrode to prevent contact between the bottom electrode and an Inter Layer Dielectric;
    wherein the shape of the bottom electrode is tunable by modulating at least one of a diameter and a length of the nanostructures to produce an increase in capacitance without increasing the footprint of the on-chip decoupling capacitor.

2. The capacitor according to claim 1, wherein the nanostructures comprise one of nanotubes and buckyballs.

3. The capacitor according to claim 1, wherein the planarized metal comprises copper.

4. The capacitor according to claim 1, wherein the nanostructures are grown side by side in a vertical direction from the planarized metal.

5. The capacitor according to claim 1, wherein a first type nanostructures are grown in a vertical direction from the planarized metal without any portion of each first type nanostructure being connected, a second type nanostructures being grown in a vertical direction from the planarized metal, each second type nanostructure having a smaller amplitude than the first type nanostructures, each second type nanostructure being grown between two first type nanostructures connecting the two first type nanostructures.

6. The capacitor according to claim 1, a first type nanostructures being grown in a vertical direction from the planarized metal without any portion of each first type nanostructure being connected, a bottom electrode material deposited between each first type nanostructures connecting the first type nanostructures.

7. The capacitor according to claim 1, wherein the nanostructures are grown side by side in a horizontal direction on top of the planarized metal.

8. The capacitor according to claim 1, wherein a first type nanostructures are grown in a horizontal direction on top of the planarized metal without any portion of each first type nanostructure being connected, a second type nanostructures being grown in a horizontal direction on top of the planarized metal, each second type nanostructure having a smaller amplitude than the first type nanostructures, each second type nanostructure being grown between two first type nanostructures connecting the two first type nanostructures.

9. The capacitor according to claim 1, a first type nanostructures being grown in a horizontal direction on top of the planarized metal without any portion of each first type nanostructure being connected, a bottom electrode material deposited between each first type nanostructures connecting the first type nanostructures.

10. An on-chip decoupling capacitor comprising:
    a bottom electrode comprising a layer of nanostructures deposited over a planarized metal to increase an effective surface area of the bottom electrode, wherein the nanostructures are grown side by side in a horizontal direction;
    a dielectric layer deposited directly on the layer of nanostructures;
    a top electrode formed directly on the dielectric layer, the top electrode including one or more conductive layers; and
    wherein the effective surface area of the bottom electrode is tunable by modulating at least one of a diameter and a length of the nanostructures to produce an increase in capacitance without increasing the footprint of the on-chip decoupling capacitor.

11. The capacitor according to claim 10, wherein a first type nanostructures are grown in a horizontal direction on top of the planarized metal without any portion of each first type nanostructure being connected, a second type nanostructures being grown in a horizontal direction on top of the planarized metal, each second type nanostructure having a smaller amplitude than the first type nanostructures, each second type nanostructure being grown between two first type nanostructures connecting the two first type nanostructures.

12. The capacitor according to claim 10, wherein a first type nanostructures being grown in a horizontal direction on top of the planarized metal without any portion of each first type nanostructure being connected, a bottom electrode material deposited between each first type nanostructures connecting the first type nanostructures.

13. An on-chip decoupling capacitor comprising:
    a bottom electrode comprising a layer of nanostructures deposited over a planarized metal to increase an effective surface area of the bottom electrode, wherein the nanostructures are grown according to an arrangement selected from the group consisting of:
        I.) a first type nanostructures grown in a vertical direction from the planarized metal without any portion of each first type nanostructure being connected, and a second type nanostructures being grown in a vertical direction from the planarized metal, each second type nanostructure having a smaller amplitude than the first type nanostructures, each second type nanostructure being grown between two first type nanostructures connecting the two first type nanostructures, and
        II.) a first type nanostructures grown in a vertical direction from the planarized metal without any portion of each first type nanostructure being connected, a bottom electrode material deposited between each first type nanostructures connecting the first type nanostructures;
    a dielectric layer deposited directly on the layer of nanostructures;
    a top electrode formed directly on the dielectric layer, the top electrode including one or more conductive layers; and
    wherein the effective surface area of the bottom electrode is tunable by modulating at least one of a diameter and a length of the nanostructures to produce an increase in capacitance without increasing the footprint of the on-chip decoupling capacitor.

14. The capacitor according to claim 13, wherein the planarized metal comprises copper.

* * * * *